(12) United States Patent
Inoue (10) Patent No.: US 7,777,584 B2
(45) Date of Patent: Aug. 17, 2010

(54) CLOCK SIGNAL GENERATOR

(75) Inventor: Yuuichirou Inoue, Miyazaki (JP)

(73) Assignee: Oki Semiconductor Co., Ltd. (JP)

( * ) Notice: Subject to any disclaimer, the term of this patent is extended or adjusted under 35 U.S.C. 154(b) by 61 days.

(21) Appl. No.: 12/331,566

(22) Filed: Dec. 10, 2008

(65) Prior Publication Data

US 2009/0160570 A1    Jun. 25, 2009

(30) Foreign Application Priority Data

Dec. 21, 2007  (JP) ............................. 2007-329560

(51) Int. Cl.
*H03B 5/32* (2006.01)
(52) U.S. Cl. .............. 331/158; 331/116 R; 331/116 FE
(58) Field of Classification Search ............ 331/116 R, 331/116 FE, 158, 182, 183
See application file for complete search history.

(56) References Cited

U.S. PATENT DOCUMENTS

| | | | | |
|---|---|---|---|---|
| 6,118,348 A | * | 9/2000 | Narahara | 331/116 FE |
| 6,690,245 B2 | * | 2/2004 | Hasegawa et al. | 331/158 |
| 7,057,468 B2 | * | 6/2006 | Wu et al. | 331/74 |
| 7,138,881 B2 | * | 11/2006 | Lin | 331/158 |
| 7,429,900 B2 | * | 9/2008 | Nunokawa et al. | 331/158 |
| 2003/0184392 A1 | * | 10/2003 | Matsushita | 331/74 |
| 2005/0017812 A1 | * | 1/2005 | Ashida et al. | 331/158 |

FOREIGN PATENT DOCUMENTS

JP            09-093040            4/1997

* cited by examiner

*Primary Examiner*—Joseph Chang
*Assistant Examiner*—Jeffrey Shin
(74) *Attorney, Agent, or Firm*—Studebaker & Brackett PC; Donald R. Studebaker (57) ABSTRACT

The present invention provides a clock signal generator capable of reducing current consumption and stably outputting a clock signal early. When it is discriminated that the amplitude of an amplification oscillation signal obtained by amplifying an oscillation signal produced from a crystal oscillator according to a constant current value has exceeded threshold amplitude, the clock signal generator generates a clock signal, based on the amplification oscillation signal. When it is discriminated that the total number of clock pulses of the clock signal has exceeded a predetermined pulse number, the clock signal generator reduces the constant current value.

3 Claims, 7 Drawing Sheets

CLOCK SIGNAL GENERATOR

BACKGROUND OF THE INVENTION

The present invention relates to a clock signal generator that generates a clock signal, based on an oscillation signal outputted from a crystal oscillator.

When a clock signal is generated based on an oscillation signal produced from a crystal oscillator, a given period of time is normally required until the clock signal is stably outputted. There is a demand that since a clock signal is generally used as a signal for providing timing when a computer is operated, it is desired to output it stably as early as possible. An oscillation control circuit which includes a crystal oscillator circuit for generating a clock signal, based on the oscillation of a crystal oscillator and a self-oscillator for generating another clock signal and which supplies the clock signal generated from the self-oscillator to a CPU during a period taken until the clock signal produced from the crystal oscillator circuit is outputted stably, and supplies the clock signal to the crystal oscillator, has been disclosed in, for example, a patent document 1 (Japanese Unexamined Patent Publication No. Hei 9(1997)-93040). According to the oscillation control circuit, it is possible to shorten a period taken until the oscillation of the crystal oscillator is accessed by the above operation and the oscillating operation of the crystal oscillator circuit becomes stable. The oscillation control circuit has means for counting pulses of the clock signal produced from the self-oscillator. When a count value obtained by the corresponding count has reached a predetermined maximum count value, the source for the supply of the clock signal to the CPU is switched from the self-oscillator to the crystal oscillator circuit. It is thus possible to decrease the probability that a program malfunction will occur due to the runaway of the CPU.

While there is a demand that it is desired to output the clock signal stably as early as possible, a reduction in current consumption at a clock signal generator is also desired. Since the amplitude of the clock signal is generally decreased when current consumption for generating the clock signal is reduced, the stop of the clock signal and a so-called "clock omission" that part of a train of clock pulses comprising a repetition of high and low levels is not outputted, occur. The oscillation control circuit of the patent document 1 is one configured assuming that all clocks of the clock signal can be counted normally. A problem arises in that when the stop of the clock signal and the clock omission take place, the operation of switching the source for the supply of the clock signal to the CPU from the self-oscillator to the crystal oscillator circuit cannot be performed normally, thus causing a device's malfunction.

SUMMARY OF THE INVENTION

The present invention has been made in view of the problems. It is therefore an object of the present invention to provide a clock signal generator capable of reducing current consumption and stably outputting a clock signal early.

According to one aspect of the present invention, for attaining the above object, there is provided a clock signal generator comprising a crystal oscillator, amplification oscillation signal generating means for amplifying an oscillation signal generated by the crystal oscillator by an amplification factor corresponding to a bias current value thereby to obtain an amplification oscillation signal, clock signal generating means for generating a clock signal, based on the amplification oscillation signal, clock pulse counting means for counting clock pulses of the clock signal thereby to obtain the total number of the clock pulses, and constant current value reducing means for reducing the bias current value where it is discriminated that the total number thereof has exceeded a current value reduction pulse number, wherein the clock signal generating means generates the clock signal where it is discriminated that the amplitude of the amplification oscillation signal has exceeded threshold amplitude.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments according to the present invention will hereinafter be described in detail with reference to the accompanying drawings.

First Preferred Embodiment

Figure 1:
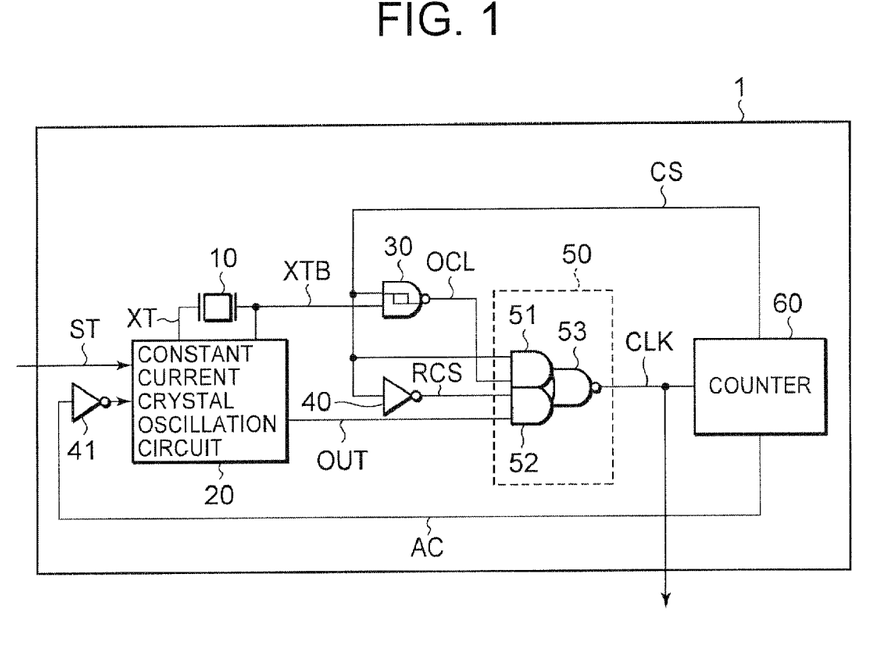
FIG. 1 is a block diagram showing a clock signal generator.

FIG. 1 is a block diagram showing a clock signal generator 1 according to the present invention. The clock signal generator 1 is of a device that generates and outputs a clock signal CLK, based on an oscillation signal XT of a crystal oscillator 10. The clock signal generator 1 includes the crystal oscillator 10, a constant current crystal oscillation circuit 20, a Schmitt circuit 30, NOT circuits 40 and 41, a selector 50 and a counter 60.

The crystal oscillator 10 supplies a resonant frequency obtained by the resonance of its own inductance component and an unillustrated capacitor to the constant current crystal oscillation circuit 20 as an oscillation signal XT.

Figure 2:
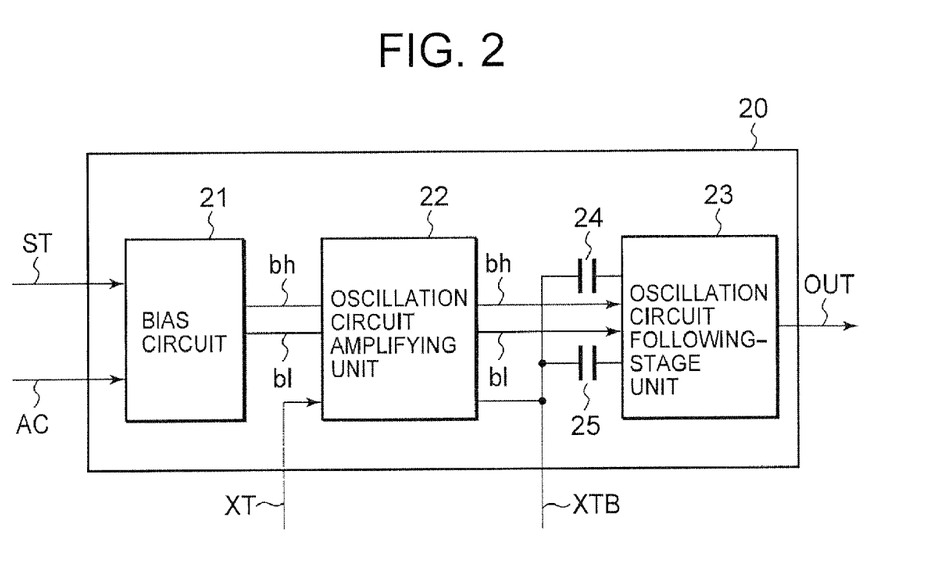
FIG. 2 is a block diagram illustrating a constant current crystal oscillation circuit.

The constant current crystal oscillation circuit 20 generates and outputs an amplification oscillation signal XTB and an oscillator clock signal OUT, based on the oscillation signal XT produced from the crystal oscillator 10. FIG. 2 is a block diagram showing the constant current crystal oscillation circuit 20. The constant current crystal oscillation circuit 20 includes a bias circuit 21, an oscillation circuit amplifying unit 22, an oscillation circuit following-stage unit 23 and capacitors 24 and 25.

The bias circuit 21 supplies bias output signals bh and bl to the oscillation circuit amplifying unit 22 and the oscillation circuit following-stage unit 23 in response to a start signal ST supplied from outside. The bias output signal bh is of a signal for controlling the value of a high level of a bias current value generated at the oscillation circuit amplifying unit 22. The bias output signal bl is of a signal for controlling the value of a low level. The bias circuit 21 used herein supplies the bias output signals bh and bl to the oscillation circuit amplifying unit 22 and the oscillation circuit following-stage unit 23 when the level of the start signal ST is transitioned from a low level to a high level.

The bias circuit 21 supplies bias output signals bh and bl each used for reducing the value of a bias current generated at the oscillation circuit amplifying unit 22 to the oscillation circuit amplifying unit 22 in response to a current value reduction signal AC sent from the counter 60. When the level of the current value reduction signal AC is transitioned from a low level to a high level, the bias circuit 21 used herein supplies the bias output signals bh and bl each used for reducing the value of the bias current to the oscillation circuit amplifying unit 22.

Figure 3:
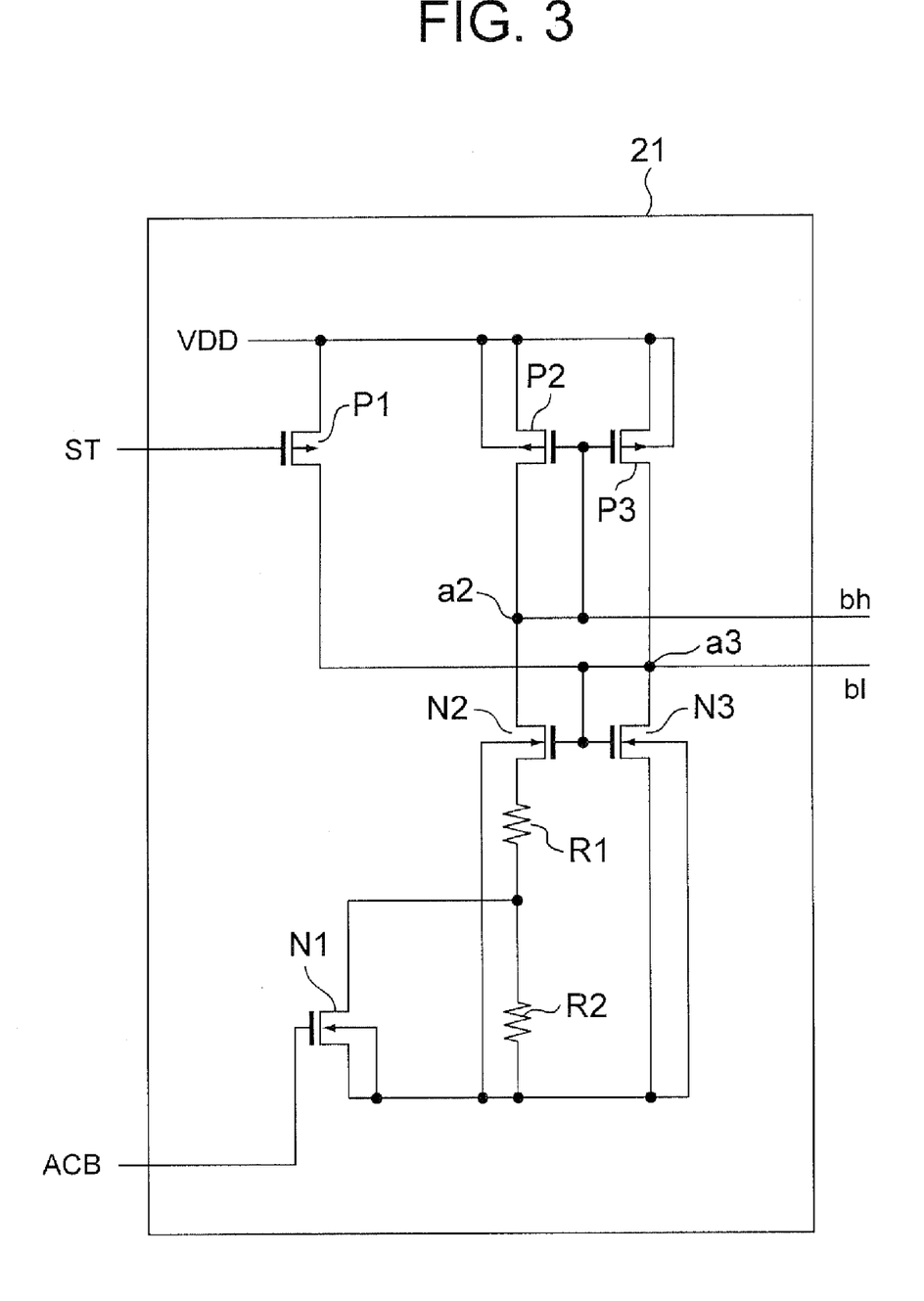
FIG. 3 is a diagram depicting one example of a circuit diagram of a bias circuit.

FIG. 3 is a diagram showing one example of a circuit diagram of the bias circuit 21. The drain of a PMOS circuit P2 and the drain of an NMOS circuit N2 are connected to each other at a connecting point a2. The drain of a PMOS circuit P3 and the drain of an NMOS circuit N3 are connected to each other at a connecting point a3. The gates of the PMOS circuits P2 and P3 and the gates of the NMOS circuits N2 and N3 are connected to one another respectively. The gate and drain of the PMOS circuit P2 and the gate and drain of the NMOS circuit N3 are connected to one another respectively. A bias signal bh is outputted from the connecting point a2 and a bias signal bl is outputted from the connecting point a3.

A start signal ST is inputted to the gate of a PMOS circuit P1. When the voltage level of the start signal ST changes from a low level to a high level, the bias circuit 21 starts up. That is, the bias signals bh and bl are outputted. The current values of the bias signals bh and bl are determined according to the difference between a gate-to-source voltage of the NMOS circuit N2 and a gate-to-source voltage of the NMOS circuit N3 and the resistance values of resistors R1 and R2 connected in series to the source of the NMOS circuit N2.

A current value reduction signal AC (hereinafter called "inverted current value reduction signal ACB") whose signal level is inverted by the NOT circuit 41 shown in FIG. 1 is inputted to the gate of the NMOS circuit N1. When the inverted current value reduction signal ACB of high level is inputted to the gate of the NMOS circuit N1, the NMOS circuit N1 is brought to an ON state (state in which current flows between the source and drain thereof), so that the resistor R2 is bypassed. Therefore, the bias currents bh and bl are determined by the resistance value of the resistor R1. On the other hand, when the inverted current value reduction signal ACB of low level is inputted to the gate of the NMOS circuit N1, the NMOS circuit N1 is brought to an OFF state (state in which no current flows between the source and drain thereof), so that the bias currents bh and hl are determined by the series resistance values of the resistors R1 and R2. Since, in this case, the resistance value becomes larger than the resistance value of the resistor R1 at that time that the inverted current value reduction signal ACB is high in level (the resistance value becomes the series resistance values of R1 and R2), the current values of the bias signals bh and bl become small.

That is, the bias circuit 21 reduces the current values of the bias signals bh and bl in response to the high-level current value reduction signal AC (low-level inverted current value reduction signal ACB) outputted from the counter 60.

The oscillation circuit amplifying unit 22 generates thereinside a bias current having a magnitude based on each of the bias output signals bh and bl outputted from the bias circuit 21. The oscillation circuit amplifying unit 22 amplifies an oscillation signal XT produced from the crystal oscillator 10 according to an amplification factor corresponding to the value of the bias current to generate and output an amplification oscillation signal XTB.

Figure 4:
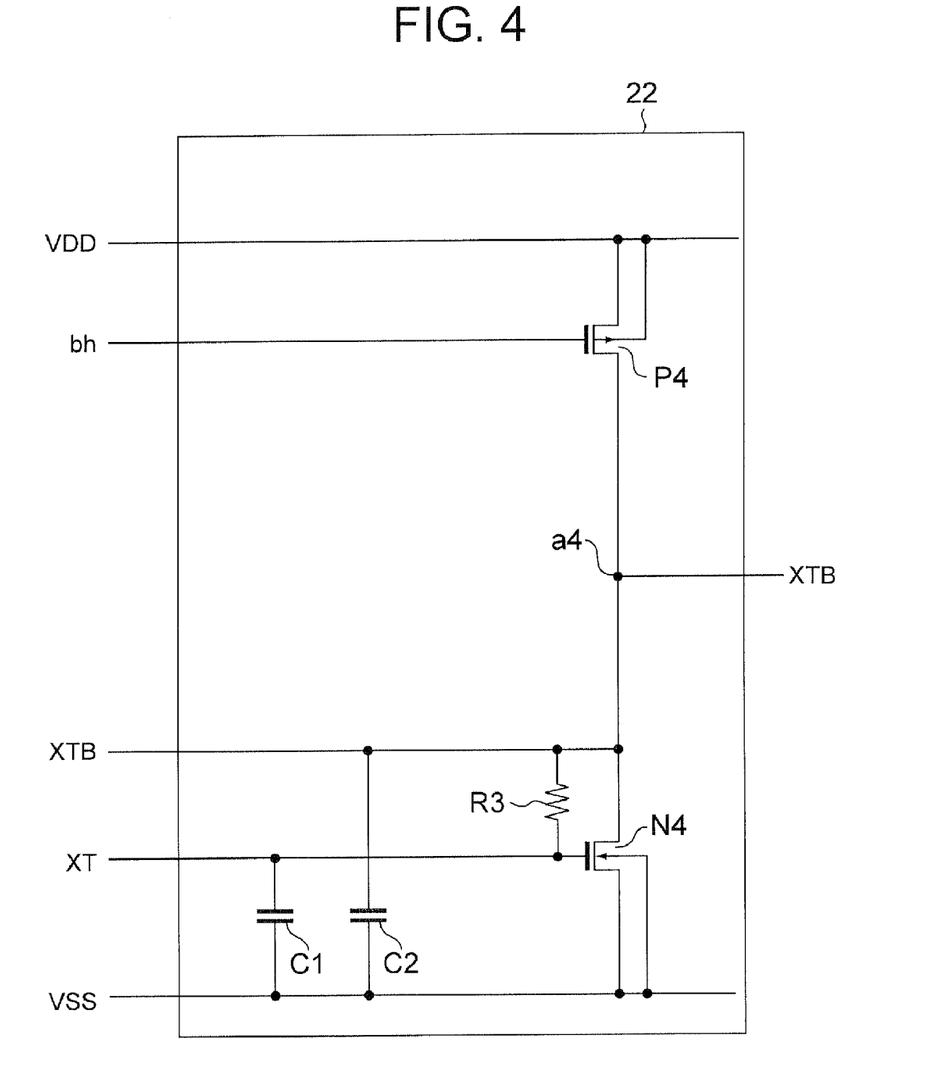
FIG. 4 is a diagram showing one example of a circuit diagram of an oscillation circuit amplifying unit.

FIG. 4 is a diagram showing one example of a circuit diagram of the oscillation circuit amplifying unit 22. Capacitors C1 and C2 are of load capacitors or capacitances for forming a resonant circuit along with an inductance component of the unillustrated crystal oscillator (crystal oscillator 10 shown in FIG. 1). While the load capacitors might be provided externally, the load capacitors are built in the oscillation circuit amplifying unit 22 herein. A resonant frequency obtained by the resonance is inputted to the oscillation circuit amplifying unit 22 as an oscillation signal XT. The resistance value of a feedback resistor R3 is a few tens of megaohms.

The drains of a PMOS circuit P4 and an NMOS circuit N4 are connected to each other at a connecting point a4. An amplification oscillation signal XTB is outputted to the subsequent-stage oscillation circuit following-stage unit 23 through the connecting point a4. A bias signal bh is inputted to the gate of the PMOS circuit 4. The dimensions of the PMOS circuit P4 are set to a few times to several tens of times the dimensions of the PMOS circuit P2 contained in the bias circuit 21. Since current equivalent to a few times to several tens of times the current of the bias signal bh flows through the NMOS circuit N4, the amplification oscillation signal XTB is amplified.

The oscillation circuit following-stage unit 23 is connected to the oscillation circuit amplifying unit 22 via the capacitors 24 and 25. When the amplitude of the amplification oscillation signal XTB sent from the oscillation circuit amplifying unit 22 exceeds predetermined oscillation amplitude WC, the oscillation circuit following-stage unit 23 amplifies the amplification oscillation signal XTB and generates and outputs a square-wave oscillator clock signal OUT, based on the amplification oscillation signal XTB. The oscillation amplitude used herein is not limited in particular and can be set to a desired amplitude value.

Figure 5:
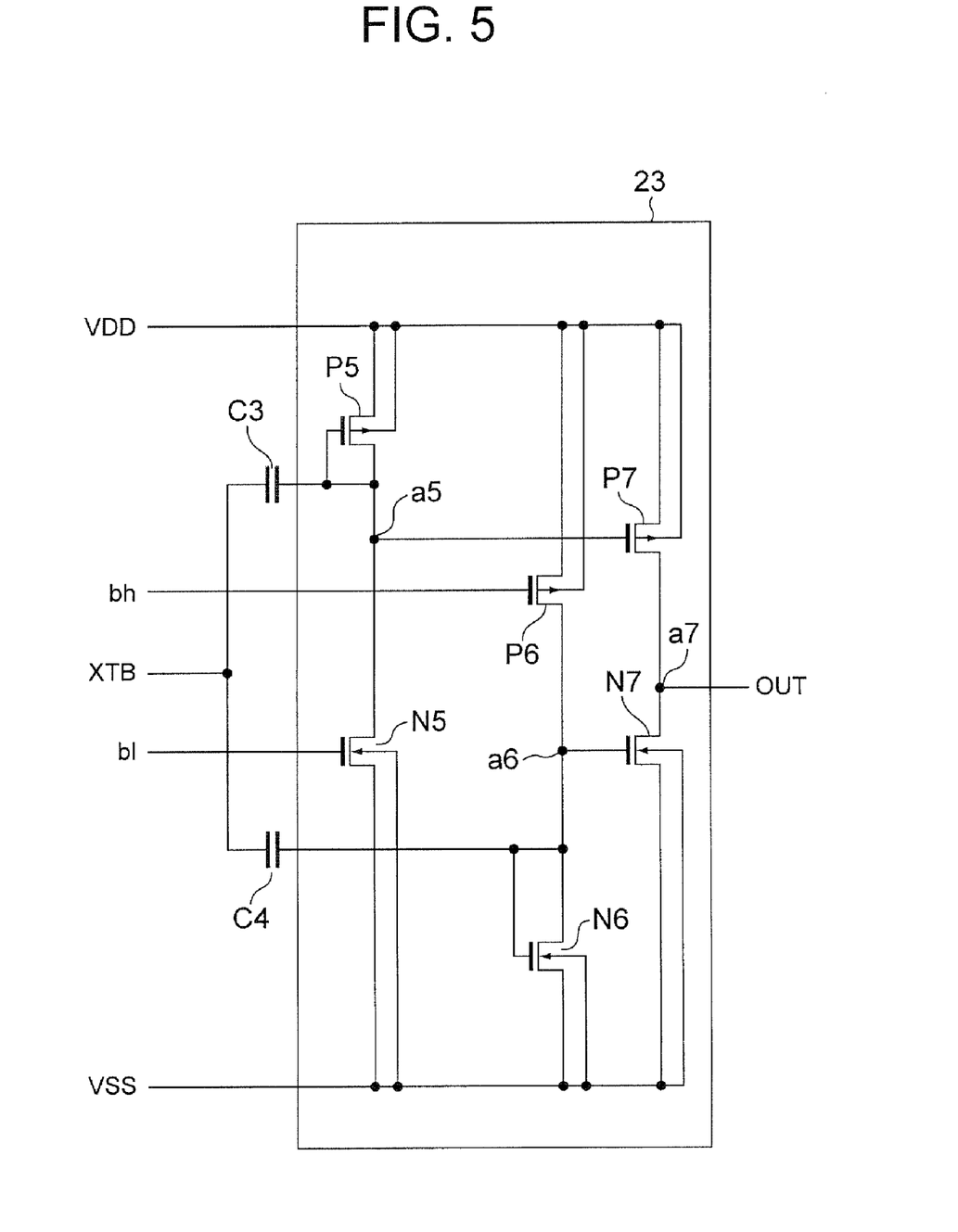
FIG. 5 is a diagram illustrating one example of a circuit diagram of an oscillation circuit following-stage unit.

FIG. 5 is a diagram showing one example of a circuit diagram of the oscillation circuit following-stage unit 23 along with capacitors C3 and C4. Incidentally, the capacitors C3 and C4 respectively correspond to the capacitors 24 and 25 shown in FIG. 2. In order to allow an amplification oscillation signal XTB having small amplitude to be outputted as a square-wave oscillator clock signal OUT and enable an operation at low power consumption, the amplification oscillation signal XTB is inputted to the capacitors C3 and C4.

The drains of a PMOS circuit P5 and an NMOS circuit N5 are connected to each other at a connecting point a5. The connecting point a5 is connected to the gate of a PMOS circuit P7. The amplification oscillation signal XTB is inputted to the gate of the PMOS circuit P5 via the capacitor C3. A bias signal bl is inputted to the gate of the NMOS circuit N5. A signal level at the connecting point a5 is determined according to these two signals. The drains of a PMOS circuit P6 and an NMOS circuit N6 are connected to each other at a connecting point a6. The connecting point a6 is connected to the gate of the NMOS circuit N7. A bias signal bh is inputted to the gate of the PMOS circuit P6. The amplification oscillation signal XTB is inputted to the gate of the NMOS circuit N6 via the capacitor C4. A signal level at the connecting point a6 is determined according to these two signals.

The drains of the PMOS circuit P7 and the NMOS circuit N7 are connected to each other at a connecting point a7. An oscillator clock signal OUT is outputted from the connecting point a7. The PMOS circuit P7 is operated by the signal level at the connecting point a5 generated by the PMOS circuit P5 and the NMOS circuit N5, and the NMOS circuit N7 is operated by the signal level at the connecting point a6 generated by the PMOS circuit P6 and the NMOS circuit N6, respectively, so that high gain can be obtained. Therefore, the square-wave oscillator clock signal OUT can be obtained even though the amplification oscillation signal XTB is small in amplitude.

The present embodiment will be explained again with reference to FIG. 1. The amplification oscillation signal XTB outputted from the constant current crystal oscillation circuit 20 is inputted to one input of the Schmitt circuit 30, and a clock selection signal CS outputted from the counter 60 is inputted to the other input thereof. The Schmitt circuit 30 has two threshold voltages having upper and lower limit values with respect to an input voltage. When the amplitude of the inputted amplification oscillation signal XTB exceeds a hysteresis width corresponding to the difference between the upper limit value and the lower limit value, the Schmitt circuit 30 generates an at-oscillation acceleration clock signal OCL, based on the amplification oscillation signal XTB and outputs the same therefrom. The hysteresis width is not limited in particular, but may be set to a suitable value in consideration of the amount of amplification of the amplitude of the amplification oscillation signal XTB with the elapse of time. The level of the at-oscillation acceleration clock signal OCL is brought to a level obtained by inverting the high and low levels of the amplification oscillation signal XTB. When the level of the clock selection signal CS is of a low level, the Schmitt circuit 30 used herein does not output the at-oscillation acceleration clock signal OCL, whereas when the level thereof is of a high level, the Schmitt circuit 30 outputs the at-oscillation acceleration clock signal OCL.

The clock selection signal CS outputted from the counter 60 is inputted to the input of the NOT circuit 40, and a clock selection inversion or reverse signal RCS obtained by inverting the level of the clock selection signal CS is supplied to the selector 50.

The at-oscillation acceleration clock signal OCL, the clock selection signal CS, the oscillator clock signal OUT and the clock selection reverse signal RCS are inputted to the input of the selector 50. When the level of the clock selection signal CS is of a high level, the selector 50 outputs the at-oscillation acceleration clock signal OCL as a clock signal CLK. When the level of the clock selection signal CS is of a low level, the selector 50 outputs the oscillator clock signal OUT as a clock signal CLK.

The selector 50 comprises AND circuits 51 and 52 and a NOR circuit 53. The at-oscillation acceleration clock signal OCL is inputted to one input of the AND circuit 50, and the clock selection signal CS is inputted to the other input thereof. The oscillator clock signal OUT is inputted to one input of the AND circuit 52, and the clock selection reverse signal RCS is inputted to the other input thereof.

When the level of the clock selection signal CS is of the high level, the at-oscillation acceleration clock signal OCL is outputted from the AND circuit 51. On the other hand, since the level of the clock selection reverse signal RCS is brought to a low level, the oscillator clock signal OUT is not outputted from the AND circuit 52. When the level of the clock selection signal CS is of the low level in reverse, the at-oscillation acceleration clock signal OCL is not outputted from the AND circuit 51. On the other hand, since the level of the clock selection reverse signal RCS is brought to a high level, the oscillator clock signal OUT is outputted from the AND circuit 52.

The output of the AND circuit 51 is connected to one input of the NOR circuit 53, and the output of the AND circuit 52 is connected to the other input thereof. When the level of the clock selection signal CS is of the high level, the NOR circuit 53 outputs the at-oscillation acceleration clock signal OCL sent from the AND circuit 51 as a clock signal CLK. When the level of the clock selection signal CS is of the low level, the NOR circuit 53 outputs the oscillator clock signal OUT sent from the AND circuit 52 as a clock signal CLK. The level of the clock signal CLK assumes a level obtained by inverting the high and low levels of the at-oscillation acceleration clock signal OCL or the oscillator clock signal OUT.

The selector 50 outputs the clock signal CLK to the outside of the clock signal generator 1 and supplies the clock signal CLK to the counter 60.

The counter 60 has clock pulse counting means which counts the total number of clock pulses each exceeding predetermined pulse amplitude, of clock pulses that form the clock signal CLK supplied from the selector 50 thereby to obtain a clock pulse total number.

The counter 60 supplies the clock selection signal CS that is high in level at its initial setting to the Schmitt circuit 30, the NOT circuit 40 and the AND circuit 51 lying in the selector 50. A signal switching pulse number is set to the counter 60 in advance. When the total number of clock pulses exceeds the signal switching pulse number, the counter 60 supplies the clock selection signal CS of low level to the Schmitt circuit 30, the NOT circuit 40 and the AND circuit 51. The signal switching pulse number is set so as to coincide with timing provided to switch the signal to be outputted as the clock signal CLK from the at-oscillation acceleration clock signal OCL to the oscillator clock signal OUT. For example, the signal switching pulse number is set to the number of pulses equal to half of a current value reduction pulse number to be described later.

The counter 60 supplies the current value reduction signal AC that is low in level at its initial setting to the constant current crystal oscillation circuit 20. The current value reduction pulse number is set to the counter 60 in advance. When the total number of clock pulses exceeds the current value reduction pulse number, the counter 60 supplies the current value reduction signal AC of high level to the constant current crystal oscillation circuit 20. The current value reduction pulse number is set so as to coincide with timing provided to reduce a current value for generating the amplification oscillation signal XTB at the constant current crystal oscillation circuit 20. That is, the current value reduction pulse number is set in such a manner that the bias current value is reduced after the amplitude of the amplification oscillation signal XTB has become large to such an extent that no clock omission occurs even when the amplitude of the amplification oscillation signal XTB is reduced due to the reduction in the bias current value.

Figure 6:
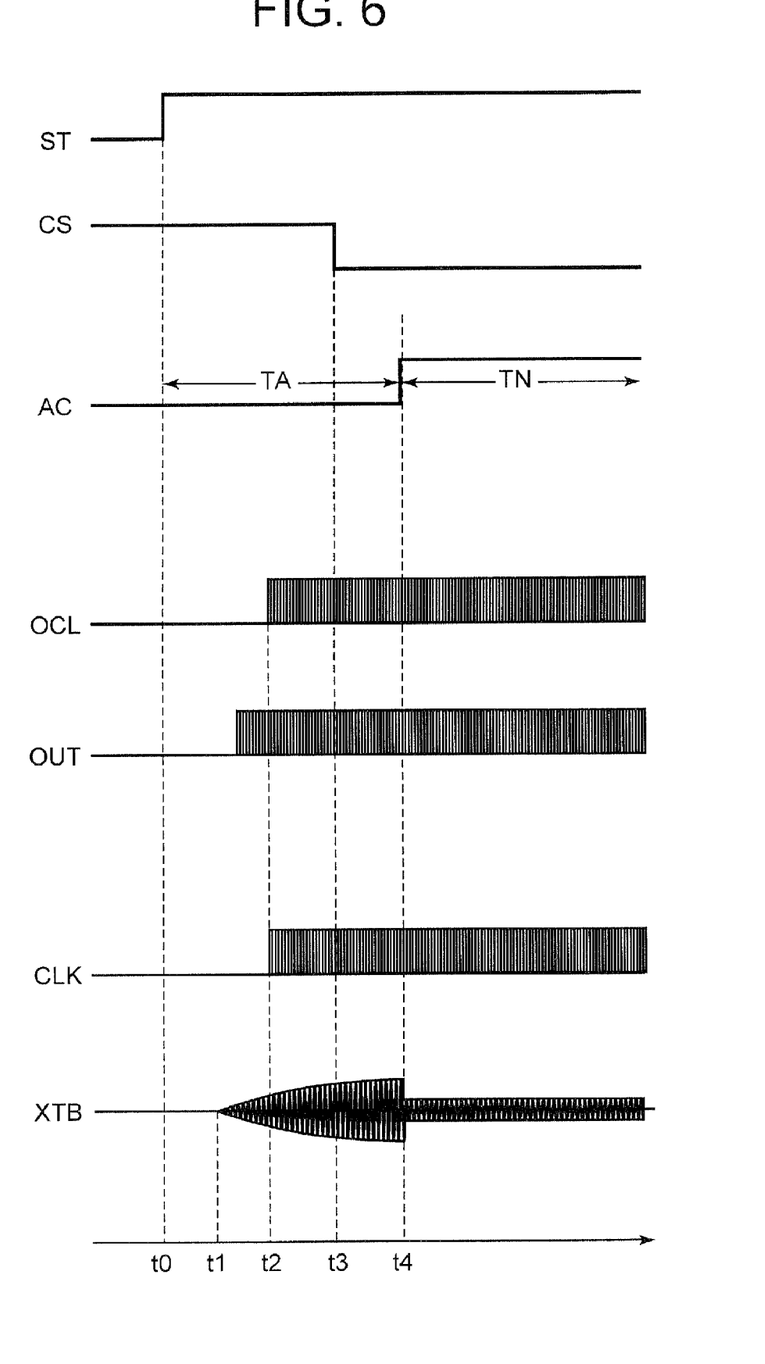
FIG. 6 is a time chart showing a clock signal, an amplification oscillation signal, etc.
Figure 7:
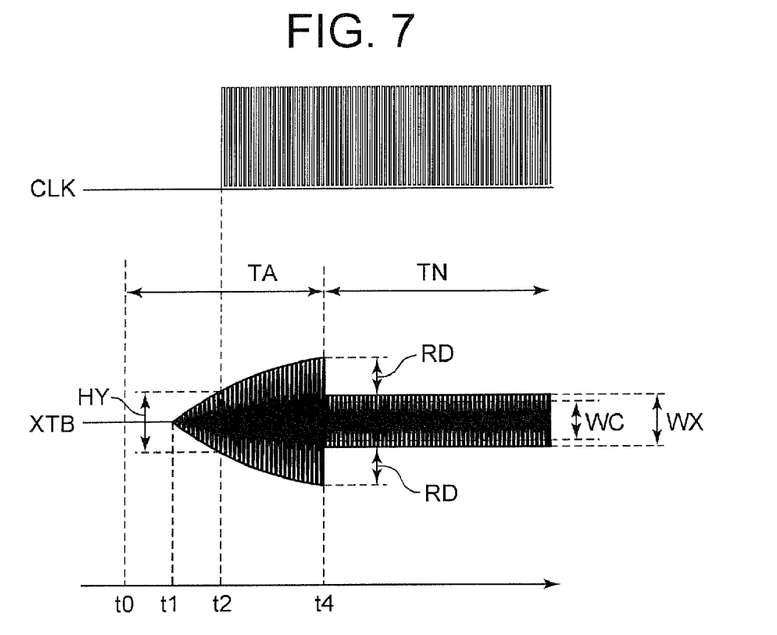
FIG. 7 is a time chart showing the clock signal and the amplification oscillation signal in enlarged form.

FIG. 6 is a time chart showing a clock signal, an amplification oscillation signal, etc. FIG. 7 is a time chart showing, in enlarged form, the clock signal and the amplification oscillation signal of the plural signals shown in FIG. 6. The operation of the clock signal generator 1 will be explained below with reference to FIGS. 6 and 7. Incidentally, the counter 60 outputs a high-level clock selection signal CS and a low-level current value reduction signal AC upon its initial setting.

The constant current crystal oscillation circuit 20 supplies bias output signals bh and bl to the oscillation circuit amplifying unit 22 in response to a change of a start signal ST inputted from outside from a low level to a high level at a time t0.

Figure 8:
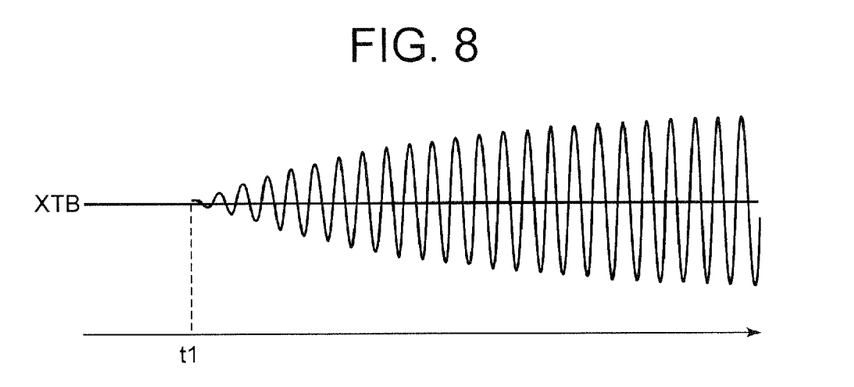
FIG. 8 is an enlarged view illustrating part of an amplification oscillation signal.

The oscillation circuit amplifying unit 22 internally generates a bias current having a magnitude based on each of the bias output signals bh and bl outputted from the constant current crystal oscillation circuit 20, amplifies an oscillation signal XT produced from the crystal oscillator 10 at an amplification factor corresponding to the bias current and starts to generate an amplification oscillation signal XTB. The oscillation circuit amplifying unit 22 starts to output the amplification oscillation signal XTB at a time t1. FIG. 8 is a diagram showing the amplification oscillation signal XTB near the time t1 in enlarged form. The amplification oscillation signal XTB is of a sine wave and the amplitude thereof gradually increases from the time t1.

When the amplitude of the amplification oscillation signal XTB outputted from the oscillation circuit amplifying unit 22 exceeds a hysteresis width HY, the Schmitt circuit 30 generates an at-oscillation acceleration clock signal OCL, based on the amplification oscillation signal XTB and starts to output the same. Assume here that the amplitude of the amplification oscillation signal XTB has exceeded the hysteresis width HY at a time t2. Even subsequently to the time t2 at which the amplitude of the amplification oscillation signal XTB has exceeded the hysteresis width HY as shown in FIG. 7, the amplitude of the amplification oscillation signal XTB continues to increase.

On the other hand, when the amplitude of the amplification oscillation signal XTB exceeds predetermined clock oscillation amplitude WC, the oscillation circuit amplifying unit 22 starts to output an oscillator clock signal OUT, based on the amplification oscillation signal XTB. Incidentally, although the oscillator clock signal OUT shown in FIG. 6 is outputted between the times t1 and t2, it may be outputted before a time t3 at which the clock selection signal CS is switched from a high level to a low level. This is made possible by adjusting the clock oscillation amplitude WC.

Figure 9:
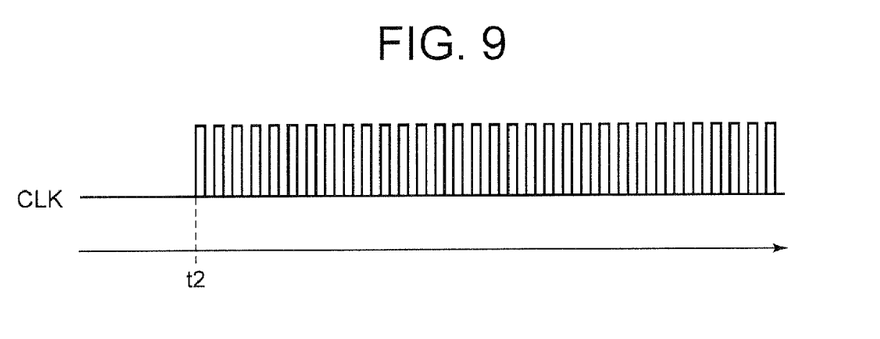
FIG. 9 is an enlarged view showing part of a clock signal.

Since the clock selection signal CS of high level is outputted from the counter 60 upon its initial setting, the selector 50 selects the corresponding at-oscillation acceleration clock signal OCL and outputs it as a clock signal CLK from the time t2. FIG. 9 is a diagram showing the clock signal CLK in the vicinity of the time t2 in enlarged form. As shown in the same figure, the clock signal CLK comprises a train of square clock pulses. Incidentally, the amplitude of the amplification oscillation signal XTB continues to increase as shown in FIGS. 6 and 7 even subsequently to the time t2 at which the clock signal CLK starts to be outputted.

The counter 60 counts clock pulses of the clock signal CLK sent from the selector 50 subsequent to the time t2 to obtain the total number thereof. When the total number of the clock pulses exceeds a preset signal switching pulse number, the counter 60 outputs a low-level clock selection signal CS. Assume here that the total number of the clock pulses has exceeded the signal switching pulse number at the time t3.

The selector 50 selects the corresponding oscillator clock signal OUT in response to a change of the clock selection signal CS from the high level to the low level and outputs it from the time t3 as the clock signal CLK.

The counter 60 continuously counts clock pulses of a clock signal CLK outputted from the selector 50. When the total number of the clock pulses exceeds a preset current value reduction pulse number, the counter 60 supplies a high-level current value reduction signal AC to the constant current crystal oscillation circuit 20. Assume here that the total number of the clock pulses (the number of pulses of the clock signal CLK between the times t2 and t4) has exceeded the current value reduction pulse number at the time t4.

The constant current crystal oscillation circuit 20 reduces the value of a bias current for generating an amplification oscillation signal XTB according to a change of the current value reduction signal AC from the low level to the high level at the time t4. Thus, the amplitude of the amplification oscillation signal XTB is reduced by a voltage width RD both high and low level sides at the time t4 and reaches normal oscillation amplitude WX. When the amplitude of the amplification oscillation signal XTB exceeds the clock oscillation amplitude WC, the oscillation circuit following-stage unit 23 lying in the constant current crystal oscillation circuit 20 outputs an oscillator clock signal OUT. Since the normal oscillation amplitude WX corresponding to the amplitude of the amplification oscillation signal XTB at the time t4 is larger than the clock oscillation amplitude WC, the oscillation circuit following-stage unit 23 outputs the corresponding oscillator clock signal OUT without causing a clock omission.

Since the clock selection signal CS lying during a normal oscillation period or interval TN is low in level, the selector 50 selects an at-oscillation acceleration clock signal OCL continuously and outputs it as the clock signal CLK.

As described above, the constant current crystal oscillation circuit 20 advances the time provided to start the oscillation of the clock signal CLK between the times t0 and t4 and continues to increase the amplitude of the amplification oscillation signal XTB in such a manner that the normal oscillation amplitude WX becomes larger than the clock oscillation amplitude WC upon a low current reduction. A period or interval from the times t0 to t4 is referred to as "acceleration oscillation period TA" below. In order to reduce current consumption, at the time t4, the constant current crystal oscillation circuit 20 reduces the value of the bias current for generating the amplification oscillation signal XTB and normally allows the amplification oscillation signal XTB to oscillate. The time subsequent to the time t4 is called "normal oscillation period TN" below.

In the conventional clock generator different from the present embodiment, which excepts the Schmitt circuit 30 and generates the clock signal CLK, based on the amplification oscillation signal XTB tentatively, there is no limit to the clock output by the hysteresis width HY. Therefore, the clock signal CLK is outputted at the time earlier than the time t2 and the total number of clock pulses exceeds the current value reduction pulse number at the time earlier than the time t4, whereby the bias current value is reduced before the amplitude of the amplification oscillation signal XTB becomes large sufficiently. Thus, the normal oscillation amplitude WX becomes smaller than the clock oscillation amplitude WC and the clock omission occurs.

On the other hand, in the clock signal generator 1 according to the present embodiment, the number of clock pulses of the clock signal CLK is counted while the clock signal CLK is being outputted. When it is discriminated that the number of the clock pulses exceeds the current value reduction pulse number, the bias current value for generating the amplification oscillation signal XTB is reduced for low current consumption. It is necessary that the amplitude of the amplification oscillation signal XTB becomes large sufficiently between the start of the output of the clock signal CLK and the reduction in the bias current (between the times t2 and t4) in such a manner that the normal oscillation amplitude WX obtained by reducing the bias current becomes larger than the clock oscillation amplitude WC preset to the oscillation circuit following-stage unit 23. The clock signal generator 1 increases the amplitude of the amplification oscillation signal XTB continuously during the acceleration oscillation period TA to enable the output of the clock signal CLK early and outputs the clock signal CLK after it has discriminated that the amplitude of the amplification oscillation signal XTB has exceeded the hysteresis width HY at the time t2, thereby increasing the amplitude of the amplification oscillation signal XTB at the time t2 and sufficiently increasing the amplitude of the amplification oscillation signal XTB between the time t2 and the time t4 at which the bias current is reduced. Since the normal oscillation amplitude WX exceeds the clock oscillation amplitude WC during the normal oscillation period TN, the clock signal generator 1 is capable of outputting the clock signal CLK with low current consumption and stably.

As described above, the clock signal generator 1 according to the present embodiment is capable of reducing current consumption and stably outputting the clock signal CLK early.

Second Preferred Embodiment

Figure 10:
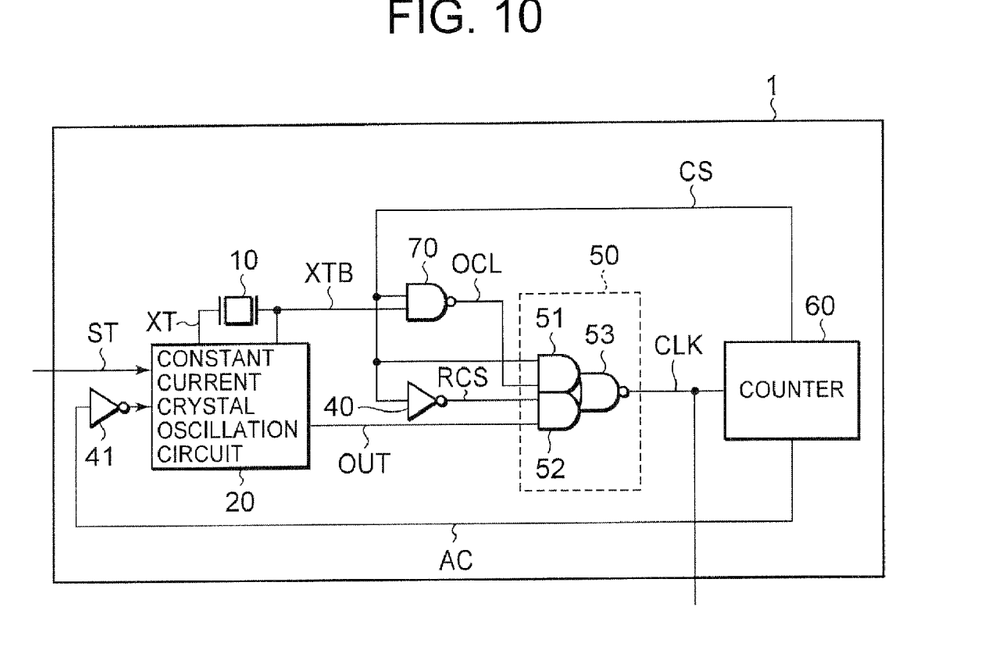
FIG. 10 is a block diagram illustrating a clock signal generator including a NAND circuit.

FIG. 10 is a block diagram showing a clock signal generator 1 including a NAND circuit 70. The present clock signal generator 1 is different in configuration from the clock signal generator 1 according to the first preferred embodiment only in that the NAND circuit 70 is included therein in place of the Schmitt circuit 30.

Either an upper limit threshold voltage or a lower limit threshold voltage relative to an input voltage is set to the NAND circuit 70. The amplitude from the center of the amplitude of an amplification oscillation signal XTB inputted to one input of the NAND circuit 70 to the threshold voltage is called "threshold amplitude SR" below. When the amplitude of the amplification oscillation signal XTB inputted to the NAND circuit 70 exceeds the threshold amplitude SR, an at-oscillation acceleration clock signal OCL is outputted from the output of the NAND circuit 70. The amplitude of the at-oscillation acceleration clock signal OCL at this time becomes twice the threshold amplitude SR. A clock signal CLK is outputted from a selector 50 in response to the at-oscillation acceleration clock signal OCL outputted from the NAND circuit 70. When the amplitude of the amplification oscillation signal XTB falls below the threshold amplitude SR (it does not reach the upper or lower limit threshold value), the at-oscillation acceleration clock signal OCL is not outputted and the clock signal CLK is not outputted either.

Figure 11:
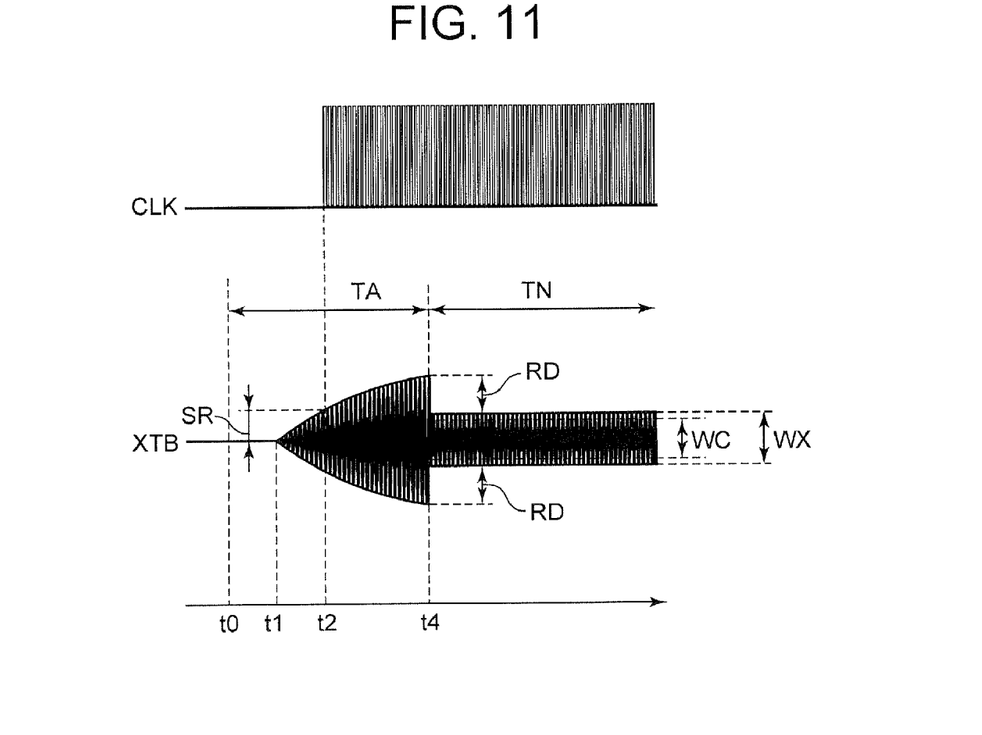
FIG. 11 is a time chart depicting a clock signal and an amplification oscillation signal in enlarged form.

FIG. 11 is a time chart showing the clock signal CLK and the amplification oscillation signal XTB in enlarged form. When the upper limit threshold value is set, the NAND circuit 70 outputs the at-oscillation acceleration clock signal OCL having amplitude equal to twice the threshold amplitude SR after the amplitude of the amplification oscillation signal XTB has exceeded the threshold amplitude SR at a time t2. This is similar even where the lower limit threshold value is set. Incidentally, the second preferred embodiment is similar in other operation to the first preferred embodiment.

The Schmitt circuit 30 included in the clock signal generator 1 according to the first preferred embodiment is of a special circuit and has the potential for not including another Schmitt circuit in the clock signal generator 1. In this case, the type of element is increased by using the Schmitt circuit 30. On the other hand, the NAND circuit 70 included in the clock signal generator 1 according to the present embodiment is of a normally used circuit. Another NAND circuit is also included in the clock signal generator 1. Therefore, the use of the NAND circuit makes it possible to bring about a similar advantageous effect without increasing the type of element. Since the type of element can be decreased, a layout area can also be reduced.

While the preferred forms of the present invention have been described, it is to be understood that modifications will be apparent to those skilled in the art without departing from the spirit of the invention. The scope of the invention is to be determined solely by the following claims.

What is claimed is:

1. A clock signal generator comprising:
   a crystal oscillator;
   amplification oscillation signal generating means for amplifying an oscillation signal generated by the crystal oscillator by an amplification factor corresponding to a bias current value thereby to obtain an amplification oscillation signal;
   clock signal generating means for generating a clock signal, based on the amplification oscillation signal;
   clock pulse counting means for counting clock pulses of the clock signal thereby to obtain the total number of the clock pulses; and
   constant current value reducing means for reducing the bias current value where it is discriminated that the total number thereof has exceeded a current value reduction pulse number,
   wherein the clock signal generating means generates the clock signal where it is discriminated that the amplitude of the amplification oscillation signal has exceeded a threshold amplitude.

2. The clock signal generator according to claim 1, wherein the clock signal generating means sets an output of a Schmitt circuit with the amplification oscillation signal as an input and a hysteresis width as the threshold amplitude as the clock signal.

3. The clock signal generator according to claim 1, wherein the clock signal generating means sets, as the clock signal, an output of a NAND circuit with the amplification oscillation signal as an input and a difference between a threshold voltage relative to an input voltage and a center voltage of the amplification oscillation signal as the threshold amplitude.

\* \* \* \* \*